(12) United States Patent
Sim et al.

(10) Patent No.: US 11,164,927 B2
(45) Date of Patent: Nov. 2, 2021

(54) ORGANIC LIGHT EMITTING DIODE DISPLAY DEVICE

(71) Applicant: LG Display Co., Ltd., Seoul (KR)

(72) Inventors: Dong-Min Sim, Paju-si (KR); Won-Hoe Koo, Paju-si (KR); Ji-Hyang Jang, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/536,230

(22) Filed: Aug. 8, 2019

(65) Prior Publication Data

US 2020/0058721 A1 Feb. 20, 2020

(30) Foreign Application Priority Data

Aug. 14, 2018 (KR) .................. 10-2018-0094902

(51) Int. Cl.
*H01L 27/32* (2006.01)
*H01L 51/50* (2006.01)
*H01L 51/52* (2006.01)

(52) U.S. Cl.
CPC ...... *H01L 27/3258* (2013.01); *H01L 27/3213* (2013.01); *H01L 27/3246* (2013.01); *H01L 51/5012* (2013.01); *H01L 51/5271* (2013.01); *H01L 27/322* (2013.01); *H01L 2251/558* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,732,809 | B2* | 6/2010 | Adachi | H01L 27/12 257/40 |
| 8,368,080 | B2* | 2/2013 | Adachi | H01L 51/5281 257/72 |
| 9,978,819 | B2* | 5/2018 | Jang | H01L 27/326 |
| 10,079,365 | B2* | 9/2018 | Kim | H01L 27/3248 |
| 10,096,659 | B2* | 10/2018 | Kim | H01L 27/322 |
| 10,319,796 | B2* | 6/2019 | Jang | H01L 27/326 |
| 10,319,948 | B2* | 6/2019 | Kim | H01L 51/5275 |
| 10,374,197 | B2* | 8/2019 | Kim | H01L 51/5271 |
| 10,608,063 | B2* | 3/2020 | Jang | H01L 27/3272 |
| 10,635,209 | B2* | 4/2020 | Seong | H01L 27/323 |
| 2005/0035353 | A1* | 2/2005 | Adachi | H01L 51/5281 257/72 |

(Continued)

FOREIGN PATENT DOCUMENTS

KR 10-2011-0032656 A 3/2011
KR 10-2018-0003244 A 1/2018

*Primary Examiner* — Telly D Green
(74) *Attorney, Agent, or Firm* — Seed IP Law Group LLP

(57) ABSTRACT

The present disclosure is directed to an organic light emitting diode display device includes a substrate having an emitting area and a non-emitting area; an overcoating layer on a first surface of the substrate and including a plurality of convex portions and a plurality of concave portions, at least one of the plurality of convex portions including a bottom surface portion, a top surface portion and a side surface portion between the bottom and top surface portions; a light emitting diode on the overcoating layer; and a cholesteric liquid crystal layer at a transmission direction of a light emitted from the light emitting diode.

18 Claims, 12 Drawing Sheets

(56) References Cited

U.S. PATENT DOCUMENTS

| | | | |
|---|---|---|---|
| 2010/0072880 A1* | 3/2010 | Adachi | H01L 27/12 313/498 |
| 2012/0007106 A1* | 1/2012 | Jung | H01L 51/5281 257/88 |
| 2013/0170033 A1* | 7/2013 | Park | G02B 5/3025 359/483.01 |
| 2014/0178706 A1* | 6/2014 | Park | G02B 1/14 428/480 |
| 2014/0240617 A1* | 8/2014 | Fukutome | G02F 1/136209 349/12 |
| 2016/0077267 A1* | 3/2016 | Inagaki | C09J 129/02 359/489.07 |
| 2016/0093833 A1* | 3/2016 | No | H01L 51/5293 257/40 |
| 2017/0038641 A1* | 2/2017 | Yamazaki | G02F 1/133308 |
| 2017/0062528 A1* | 3/2017 | Aoyama | G02F 1/133514 |
| 2017/0062769 A1* | 3/2017 | Kim | H01L 51/5275 |
| 2017/0062770 A1* | 3/2017 | Jang | H01L 51/5271 |
| 2017/0082887 A1* | 3/2017 | Kubota | G02F 1/1333 |
| 2017/0084676 A1* | 3/2017 | Jang | H01L 51/5275 |
| 2017/0125738 A1* | 5/2017 | Kim | H01L 51/5225 |
| 2017/0176791 A1* | 6/2017 | Kubota | H01L 27/1225 |
| 2017/0205959 A1* | 7/2017 | Seong | H01L 51/5271 |
| 2018/0046294 A1* | 2/2018 | Wang | G06F 3/0416 |
| 2018/0076394 A1* | 3/2018 | Kawakami | H01L 51/0065 |
| 2018/0085859 A1* | 3/2018 | Yamazaki | H01L 51/003 |
| 2018/0190719 A1* | 7/2018 | Kim | H01L 51/5225 |
| 2018/0247987 A1* | 8/2018 | Jang | H01L 27/3246 |
| 2018/0299603 A1* | 10/2018 | Lee | H01L 51/5281 |
| 2018/0358581 A1* | 12/2018 | Kim | H01L 27/3248 |
| 2018/0366524 A1* | 12/2018 | Bang | H01L 51/0021 |
| 2019/0067642 A1* | 2/2019 | Kim | H01L 27/3246 |
| 2019/0103418 A1* | 4/2019 | Han | H01L 27/3246 |
| 2019/0165323 A1* | 5/2019 | Jo | H01L 51/5225 |
| 2019/0267439 A1* | 8/2019 | Jang | H01L 27/3258 |
| 2019/0312233 A1* | 10/2019 | Kim | H01L 51/5275 |

* cited by examiner

ORGANIC LIGHT EMITTING DIODE DISPLAY DEVICE

CROSS REFERENCE TO RELATED APPLICATIONS

The present application claims the priority benefit of Korean Patent Application No. 10-2018-0094902 filed in Republic of Korea on Aug. 14, 2018, which is hereby incorporated by reference in its entirety for all purposes as if fully set forth herein.

BACKGROUND

Technical Field

The present disclosure relates to an organic light emitting diode display device, and more particularly, to an organic light emitting diode display device where a light extraction efficiency is improved.

Description of the Related Art

Recently, with the advent of an information-oriented society, as interest in information displays for processing and displaying a massive amount of information and demand for portable information media have increased, a display field has rapidly advanced. Thus, various light and thin flat panel display devices have been developed and highlighted.

Among the various flat panel display devices, an organic light emitting diode (OLED) display device is an emissive type device and does not require a backlight unit used in a non-emissive type device such as a liquid crystal display (LCD) device. As a result, the OLED display device has a light weight and a thin profile.

In addition, the OLED display device has advantages of a viewing angle, a contrast ratio, and power consumption as compared with the LCD device. Furthermore, the OLED display device can be driven with a low direct current (DC) voltage and has rapid response speed. Moreover, since inner elements of the OLED display device have a solid phase, the OLED display device has high durability against an external impact and has a wide available temperature range.

In the OLED display device, while light emitted from a light emitting layer passes through various components and is emitted to an exterior, a large amount of the light is lost. As a result, the light emitted to the exterior of the OLED display device is only 20% of the light emitted from the light emitting layer.

Here, since the amount of the light emitted from the light emitting layer is increased along with the amount of a current applied to the OLED display device, it is possible to further increase luminance of the OLED display device by applying more currents to the light emitting layer. However, in this case, power consumption is increased, and lifetime of the OLED display device is also reduced.

Therefore, to improve a light extraction efficiency of the OLED display device, an OLED display device where a microlens array (MLA) is attached to an outer surface of a substrate or a microlens is formed in an overcoating layer has been suggested.

However, even when the microlens array is attached to the outer surface of the OLED display device or the microlens is formed in the OLED display device, a large amount of light is confined in the OLED display device and only a small amount of light is extracted to an exterior.

In addition, as a viewing angle is improved in the OLED display device, a display quality can be deteriorated. Further, a visibility of a black color can be deteriorated due to a relatively high reflectance.

BRIEF SUMMARY

Accordingly, the present disclosure is directed to an organic light emitting diode display device that substantially obviates one or more of the problems due to limitations and disadvantages of the related art.

Various embodiments of the present disclosure provide an organic light emitting diode display device where a light extraction efficiency is improved and a lifetime is extended.

Various embodiments of the present disclosure provide an organic light emitting diode display device where deterioration in display quality due to increase of a viewing angle is prevented and a visibility of a black color is improved due to reduction in reflectance.

Additional features and advantages of various embodiments of the present disclosure will be set forth in the description which follows, and in part will be apparent from the description, or may be learned by practice of the various embodiments of the present disclosure. These and other advantages of the various embodiments of the present disclosure will be realized and attained by the structure particularly pointed out in the written description and claims hereof as well as the appended drawings.

To achieve these and other advantages and in accordance with the various embodiments of the present disclosure, as embodied and broadly described herein, an organic light emitting diode display device includes: a substrate having an emitting area and a non-emitting area; an overcoating layer on a first surface of the substrate and including a plurality of convex portions and a plurality of concave portions, at least one of the plurality of convex portions including a bottom surface portion, a top surface portion and a side surface portion between the bottom and top surface portions; a light emitting diode on the overcoating layer; and a cholesteric liquid crystal layer at a transmission direction of a light emitted from the light emitting diode.

It is to be understood that both the foregoing general description and the following detailed description are exemplary and explanatory and are intended to provide further explanation of various embodiments of the present disclosure as claimed.

BRIEF DESCRIPTION OF THE SEVERAL VIEWS OF THE DRAWINGS

The accompanying drawings, which are included to provide a further understanding of various embodiments of the present disclosure and are incorporated in and constitute a part of this specification, illustrate embodiments of the disclosure and together with the description serve to explain the principles of the disclosure. In the drawings.

DETAILED DESCRIPTION

Reference will now be made in detail to the present disclosure, examples of which are illustrated in the accompanying drawings.

Figure 1:
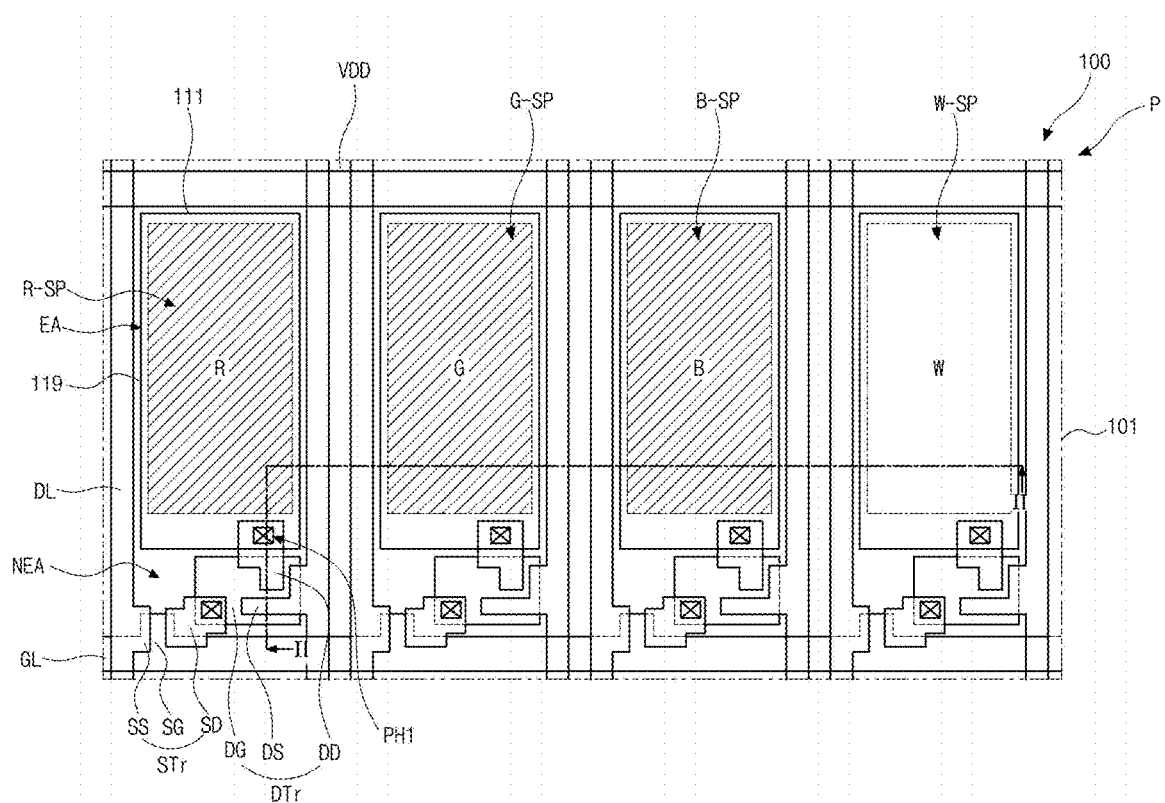
FIG. 1 is a plan view showing an organic light emitting diode display device according to a first embodiment of the present disclosure.
Figure 2:
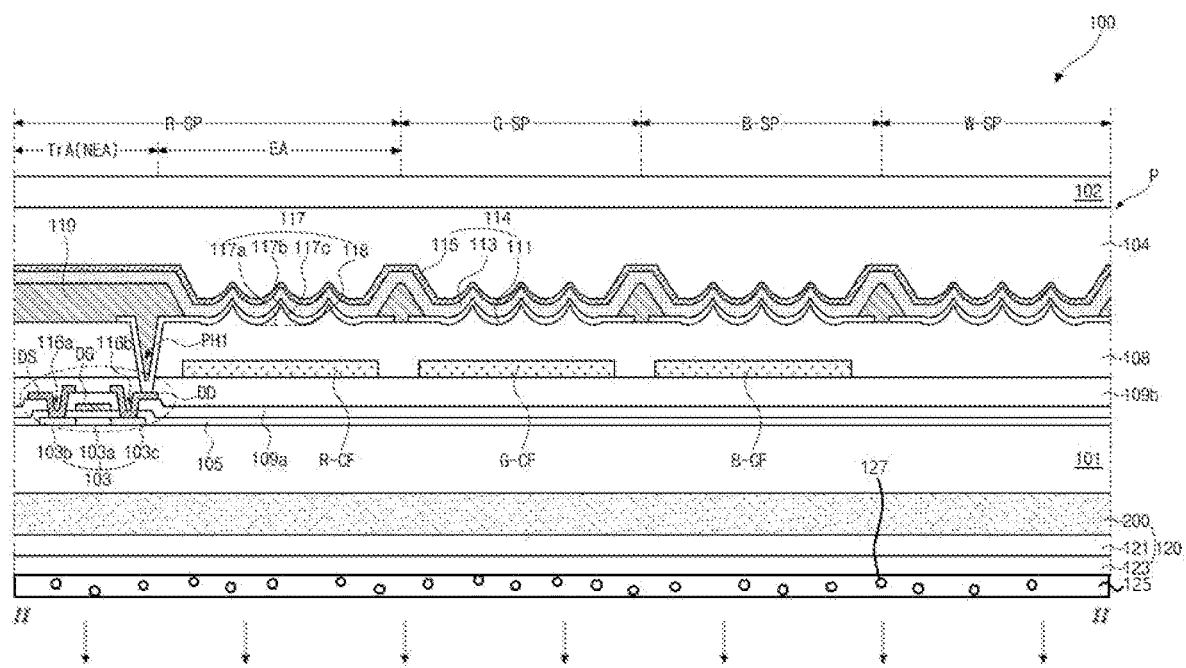
FIG. 2 is a cross-sectional view taken along a line II-II of FIG. 1.

FIG. 1 is a plan view showing an organic light emitting diode display device according to a first embodiment of the present disclosure, and FIG. 2 is a cross-sectional view taken along a line II-II of FIG. 1. The components of the organic light emitting diode display devices according to embodiments of the present disclosure are operatively coupled and configured.

In FIGS. 1 and 2, an organic light emitting diode (OLED) display device 100 can have a top emission type or a bottom emission type according to an emission direction of a light. A bottom emission type OLED display device can be exemplarily illustrated hereinafter.

In FIG. 1, the OLED display device 100 includes a single pixel P having red, green, blue and white sub-pixels R-SP, G-SP, B-SP and W-SP. Each of the red, green, blue and white sub-pixels R-SP, G-SP, B-SP and W-SP includes an emitting area EA and a non-emitting area NEA at a periphery of the emitting area EA. A bank 119 is disposed in the non-emitting area NEA.

Although the red, green, blue and white sub-pixels R-SP, G-SP, B-SP and W-SP have the same width as each other in the first embodiment, the red, green, blue and white sub-pixels R-SP, G-SP, B-SP and W-SP can have different width from each other to have various shapes in another embodiment.

A switching thin film transistor (TFT) STr and a driving TFT DTr are disposed in the non-emitting area NEA of each of the red, green, blue and white sub-pixels R-SP, G-SP, B-SP and W-SP. A light emitting diode 114 having a first electrode 111 of an anode, a light emitting layer 113 and a second electrode 115 of a cathode is disposed in the emitting area EA of each of the red, green, blue and white sub-pixels R-SP, G-SP, B-SP and W-SP.

The switching TFT STr and the driving TFT DTr are connected to each other, and the driving TFT DTr is connected to the light emitting diode 114.

A gate line GL, a data line DL and a power line VDD cross each other to define the red, green, blue and white sub-pixels R-SP, G-SP, B-SP and W-SP.

The switching TFT STr is disposed in a crossing portion of the gate line GL and the data line DL and selects one of the red, green, blue and white sub-pixels R-SP, G-SP, B-SP and W-SP.

The switching TFT STr includes a gate electrode SG connected to the gate line GL, a semiconductor layer, a source electrode SS and a drain electrode SD.

The driving TFT DTr drives the light emitting diode 114 of the one of the red, green, blue and white sub-pixels R-SP, G-SP, B-SP and W-SP selected by the switching TFT STr. The driving TFT DTr includes a gate electrode DG connected to the drain electrode SD of the switching TFT STr, a semiconductor layer 103, a source electrode DS connected to the power line VDD and a drain electrode DD connected to the first electrode 111 of the light emitting diode 114.

The light emitting layer 113 is disposed between the first and second electrodes 111 and 115.

In FIG. 2, the semiconductor layer 103 is disposed in a switching area TrA of each of the red, green, blue and white sub-pixels R-SP, G-SP, B-SP and W-SP on a substrate 101. The semiconductor layer 103 includes an active region 103a of silicon of a channel and source and drain regions 103b and 103c of impurity-doped silicon at both sides of the active region 103a.

A gate insulating layer 105 is disposed on the semiconductor layer 103.

The gate electrode DG is disposed on the gate insulating layer 105 over the semiconductor layer 103 and the gate line GL is disposed on the gate insulating layer 105 along one direction.

A first interlayer insulating layer 109a is disposed on the gate electrode DG and the gate line GL. The first interlayer insulating layer 109a and the gate insulating layer 105 include first and second semiconductor contact holes 116a and 116b exposing the source and drain regions 103b and 103c, respectively, at both sides of the active region 103a.

The source and drain electrodes DS and DD spaced apart from each other are disposed on the first interlayer insulating layer 109a. The source electrode DS is connected to the source region 103b through the first semiconductor contact hole 116a, and the drain electrode DD is connected to the drain region 103c through the second semiconductor contact hole 116b.

A second interlayer insulating layer 109b is disposed on the source and drain electrodes DS and DD and the first interlayer insulating layer 109a exposed between the source and drain electrodes DS and DD. The second interlayer insulating layer 109b has a first drain contact hole PH1 exposing the drain electrode DD of the driving TFT DTr.

The source and drain electrodes DS and DD, the semiconductor layer 103 having the source and drain regions 103b and 103c connected to the source and drain electrodes DS and DD, the gate insulating layer 105 on the semiconductor layer 103 and the gate electrode DG constitute the driving TFT DTr.

In one embodiment, the switching TFT STr has the same structure as the driving TFT DTr and is connected to the driving TFT DTr.

Although the switching TFT STr and the driving TFT DTr have a top gate type where the semiconductor layer 103 includes a polycrystalline silicon semiconductor layer or an oxide semiconductor layer in the first embodiment, the switching TFT STr and the driving TFT DTr can have a bottom gate type where the semiconductor layer 103 includes an intrinsic or impurity-doped amorphous silicon semiconductor layer in another embodiment.

The substrate 101 can include a glass or a transparent plastic material such as polyimide flexible or bendable. When the substrate 101 includes a plastic material, polyimide having an excellent heat resistance may be used for the substrate 101 based on a deposition process of a high temperature. A whole of the substrate 101 can be covered with at least one buffer layer.

A threshold voltage of the driving TFT DTr in the switching area TrA can be shifted due to a light. To prevent the threshold voltage shift, a light shielding layer can be disposed under the semiconductor layer 103 in the OLED display device 100 according to the first embodiment of the present disclosure.

The light shielding layer can be disposed between the substrate 101 and the semiconductor layer 103 to block the incident light to the semiconductor layer 103 through the substrate 101. As a result, the threshold voltage shift due to the external light is minimized. The light shielding layer can be covered with the buffer layer.

Red, green and blue wavelength converting layers R-CF, G-CF and B-CF are disposed on the second interlayer insulating layer 109b in the emitting area EA of the red, green and blue sub-pixels R-SP, G-SP and B-SP, respectively.

The red, green and blue wavelength converting layers R-CF, G-CF and B-CF transmit the wavelengths of red, green and blue colors, respectively. The red wavelength converting layer R-CF in the red sub-pixel R-SP can include a red color filter, the green wavelength converting layer G-CF in the green sub-pixel G-SP can include a green color filter, and the blue wavelength converting layer B-CF in the blue sub-pixel B-SP can include a blue color filter.

The wavelength converting layer is not disposed in the white sub-pixel W-SP, and a white light from the light emitting diode 114 can intactly pass through the white sub-pixel W-SP.

The red, green and blue wavelength converting layer R-CF, G-CF and B-CF in the red, green and blue sub-pixels R-SP, G-SP and B-SP can include a quantum dot which have a size capable of emitting a light of a predetermined color corresponding to each of the red, green and blue sub-pixels R-SP, G-SP and B-SP according to the white light emitted from the light emitting diode 114 to the substrate 101. Here, the quantum dot can include at least one selected from a group including CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs and SbTe. However, a material of the quantum dot is not limited thereto.

For example, the red wavelength converting layer R-CF in the red sub-pixel R-SP can include a quantum dot of CdSe or InP, the green wavelength converting layer G-CF in the green sub-pixel G-SP can include a quantum dot of CdZnSeS, and the blue wavelength converting layer B-SP in the blue sub-pixel B-SP can include a quantum dot of ZnSe. The OLED display device 100 where the red, green and blue wavelength converting layers R-CF, G-CF and B-CF include a quantum dot can have a relatively high color reproducibility.

In another embodiment, the red, green and blue wavelength converting layers R-CF, G-CF and B-CF can include a color filter containing a quantum dot.

An overcoating layer 108 which has a drain contact hole PH1 exposing the drain electrode DD with the second interlayer insulating layer 109b is disposed on the red, green and blue wavelength converting layers R-CF, G-CF and B-CF. The overcoating layer 108 has a plurality of convex portions 117 and a plurality of concave portions 118 on a top surface thereof. The plurality of convex portions 117 and the plurality of concave portions 118 are alternately disposed with each other to constitute a microlens ML.

The overcoating layer 108 can include an insulating material having a refractive index of 1.5. For example, the overcoating layer 108 can include one of acrylic resin, epoxy resin, phenol resin, polyamide resin, polyimide resin, unsaturated polyester resin, polyphenylene resin, polyphenylenesulfide resin, benzocyclobutene and photoresist. However, a material of the overcoating layer 108 is not limited thereto.

The plurality of convex portions 117 can have a structure to define or surround the plurality of concave portions 118, respectively, and can have a bottom surface portion 117a, a top surface portion 117b and a side surface portion 117c.

The side surface portion 117c can be a whole of a slanted surface constituting the top surface portion 117b. A slope of the side surface portion 117c can increase from the bottom surface portion 117a to the top surface portion 117b such that the side surface portion 117c can have a maximum slope Smax at a portion adjacent to the top surface portion 117b.

Since a path of a light emitted from the light emitting layer 113 is changed toward the substrate 101 by the plurality of convex portions 117, the light extraction efficiency of the OLED display device 100 increases.

A first electrode 111 connected to the drain electrode DD of the driving TFT DTr is disposed on the overcoating layer 108 constituting the microlens ML. For example, the first electrode 111 can be an anode of the light emitting diode 114 and can include a material having a relatively high work function.

The first electrode 111 is disposed in each of the red, green, blue and white sub-pixels R-SP, G-SP, B-SP and W-SP, and the bank 119 is disposed between the first electrodes 111 in the adjacent sub-pixels R-SP, G-SP, B-SP and W-SP. The first electrode 111 is separated in each of the red, green, blue and white sub-pixels R-SP, G-SP, B-SP and W-SP with the bank 119 as a border between the adjacent sub-pixels R-SP, G-SP, B-SP and W-SP.

The bank 119 includes an opening exposing the first electrode 111, and the opening of the bank 119 is disposed to corresponds to the emitting area EA. The plurality of convex portions 117 and the plurality of concave portions 118 constituting the microlens ML are disposed in a whole of the opening of the bank 119. For example, the plurality of convex portions 117 and the plurality of concave portions 118 can contact an edge portion of the bank 119.

Further, the opening of the bank 119 is disposed to correspond to each of the red, green and blue wavelength converting layers R-CF, G-CF and B-CF. For example, the edge portion of the bank 119 can overlap an edge portion of each of the red, green and blue wavelength converting layers R-CF, G-CF and B-CF. Since each of the red, green and blue wavelength converting layers R-CF, G-CF and B-CF 106 overlaps the bank 119, a leakage of a light not passing through each of the red, green and blue wavelength converting layers R-CF, G-CF and B-CF is prevented.

The light emitting layer 113 is disposed on the first electrode 111. The light emitting layer 113 can have a single layer of an emitting material. Alternatively, the light emitting layer 113 can have a multiple layer including a hole injecting layer, a hole transporting layer, an emitting material layer, an electron transporting layer and an electron injecting layer for increasing an emission efficiency.

The first electrode 111 and the light emitting layer 113 sequentially on the overcoating layer 108 can have a shape according to a morphology of the plurality of convex portions 117 and the plurality of concave portions 118 of the top surface of the overcoating layer 108 to constitute the microlens ML.

The second electrode 115 is disposed on a whole of the light emitting layer 113. For example, the second electrode 115 can be a cathode.

The second electrode 115 can have a shape according to a morphology of the plurality of convex portions 117 and the plurality of concave portions 118 of the top surface of the overcoating layer 108 to constitute the microlens ML.

When a voltage is applied to the first and second electrodes 111 and 115 according to a signal, a hole injected from the first electrode 111 and an electron injected from the second electrode 115 are transmitted to the light emitting layer 113 to constitute an exciton. When the exciton transitions from an excited state to a ground state, a light can be emitted from the light emitting layer 113 as a visible ray.

The light of the light emitting layer 113 can pass through the transparent first electrode 111 to be emitted toward an exterior such that an image is displayed.

Since the overcoating layer 108 constitutes the microlens ML, the light confined in the interior of the light emitting layer 113 due to a total reflection can be transmitted with an angle smaller than a critical angle of the total reflection by the microlens ML of the overcoating layer 108 to be extracted to the exterior by a multiple reflection. As a result, the light extraction efficiency of the OLED display device 100 is improved.

In addition, since the microlens ML of the overcoating layer 108, the first electrode 111, the light emitting layer 113 and the second electrode 115 is disposed in a whole of the opening of the bank 119 corresponding to the emitting area EA, the whole of the emitting area EA is used for the microlens ML and the light extraction efficiency is maximized.

A protecting film 102 of a thin film type is disposed on the driving TFT DTr and the light emitting diode 114, and a face seal 104 is disposed between the light emitting diode 114 and the protecting film 102. The face seal 104 can include an organic material or an inorganic material which is transparent and has an adhesive property. The protecting film 102 and the substrate 101 can be attached to each other by the face seal 104 to encapsulate the OLED display device 100.

To prevent penetration of an external oxygen and a moisture into an interior of the OLED display device 100, the protecting film 102 can include at least two inorganic protecting films. An organic protecting film for supplementing impact resistance of the at least two inorganic protecting films can be interposed between the at least two inorganic protecting films.

In the structure where the organic protecting film and the inorganic protecting film are alternately laminated with each other, the inorganic protecting film can completely wrap the organic protecting film such that penetration of the moisture and the oxygen through a side surface of the organic protecting film is prevented.

As a result, penetration of the moisture and the oxygen from the exterior to the interior of the OLED display device 100 can be prevented.

In the OLED display device 100, a polarizing plate 120 for preventing reduction of a contrast ratio due to an external light can be disposed on an outer surface of the transparent substrate 101. Since the polarizing plate 120 blocking the external light is disposed on a surface of the OLED display device 100 in a driving mode where a light from the light emitting layer 113 is emitted, the contrast ratio increases.

As a result, the polarizing plate 120 can include a circular polarizing plate having a retardation plate 121 and a linear polarizing plate 123.

For example, the linear polarizing plate 123 can be disposed adjacent to an incident surface and the retardation plate 121 can be disposed at an inner portion of the linear polarizing plate 123.

The retardation plate 121 can include a quarter wave plate (QWP) having a retardation of $\lambda/4$.

The linear polarizing plate 123 has a polarizing axis and linearly polarizes a non-polarized light. For example, the linear polarizing plate 123 can transmit a component of the non-polarized light parallel to the polarizing axis and can absorb a component of the non-polarized light not parallel to the polarizing axis. As a result, the non-polarized light becomes a linearly polarized light along the polarizing axis through the linear polarizing plate 123.

A surface treatment layer 125 can be disposed on an outer surface of the linear polarizing plate 123. For example, the surface treatment layer 125 can be an anti-glare layer including a silica bead 127 or a hard coating layer for preventing a damage of the surface of the polarizing plate 120.

In the OLED display device 100, reflection of the external light can be minimized by the polarizing plate 120 and reduction of the contrast ratio can be prevented.

Specifically, a cholesteric liquid crystal (CLC) layer 200 is disposed between the retardation plate 121 and the substrate 101. For example, the CLC layer 200 can be disposed at a transmission direction of a light emitted from the light emitting diode 114.

The CLC layer 200 has a layer structure similar to a smectic liquid crystal, and a long axis of a liquid crystal molecule is arranged in a horizontal surface similar to a nematic liquid crystal. The liquid crystal molecules each having a thin and long shape are disposed in a first horizontal surface such that long axes thereof are arranged along a first direction. In addition, the liquid crystal molecules are disposed in a second horizontal surface parallel to the first horizontal surface such that long axes thereof are arranged along a second direction different from the first direction. The long axes of the liquid crystal molecules rotate along a direction perpendicular to the first and second surface. As a result, the liquid crystal molecules have a helical structure.

The CLC layer 200 can selectively transmit or reflect a circularly polarized light. For example, the CLC layer 200 can selectively transmit one of the right-handed and left-handed circularly polarized lights and can selectively reflect the other of the right-handed and left-handed circularly polarized lights.

The light reflected by the CLC layer 200 is recycled to increase a luminance, and the light transmitted by the CLC layer 200 has a polarization axis parallel to a transmission axis of the linear polarizing plate 123 to increase a transmittance.

For example, the CLC layer 200 can reflect one of the right-handed and left-handed circularly polarized lights having a wavelength of a blue color and can transmit the other of the right-handed and left-handed circularly polarized lights having a wavelength of a blue color. As a result, an emission efficiency of the blue color increases and an efficiency of a full color (WRGB) driving is improved.

In the OLED display device 100, a light extraction efficiency increases due to the microlens ML. In addition, since the blue CLC layer 200 capable of recycling a blue colored light is disposed on an outer surface of the substrate 101, the luminance of the blue colored light having a relatively short wavelength as compared with the other colors increases and the efficiency of the full color driving is improved.

Specifically, since the luminance of the blue colored light increases, a color temperature of the OLED display device 100 increases. A chromaticity of a light source or a reference white color can be expressed as a temperature of a nearest region of a radiation curve instead of a coordinate of a two dimensional color chart. The temperature of the chromaticity can be referred to as a correlated color temperature or a color temperature.

The color temperature is used as a value showing a degree of a light close to a color. When a display device emits a light close to a blue color, the light has a relatively high color temperature. When a display device emits a light close to a yellow color, the light has a relatively low color temperature. As the light has a higher color temperature, an image has a higher display quality.

In the OLED display device 100, since the luminance of the blue colored light increases, the color temperature of the light increases and the display quality of the image is improved.

Further, deterioration in display quality according to increase in viewing angle is prevented by the CLC layer 200.

Figure 3:
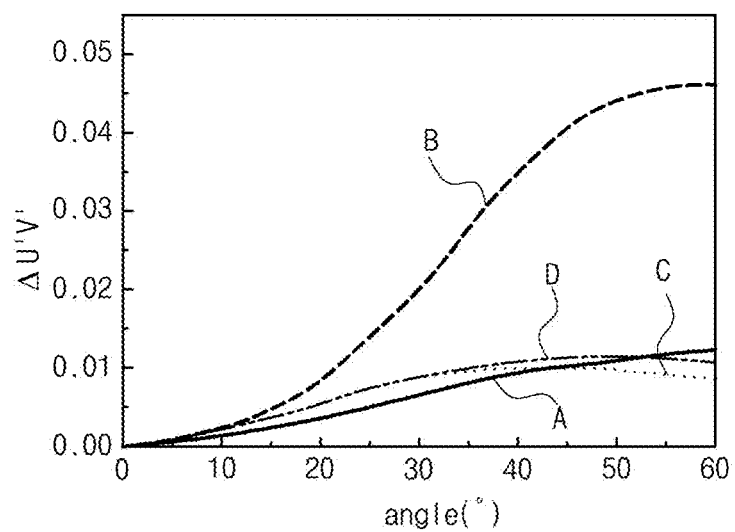
FIG. 3 is a graph showing a luminance with respect to a viewing angle of an organic light emitting diode display device according to a first embodiment of the present disclosure.

FIG. 3 is a graph showing a luminance with respect to a viewing angle of an organic light emitting diode display device according to a first embodiment of the present disclosure.

In FIG. 3, the x-axis represents a viewing angle and the y-axis represents a color difference (Δu'v') (arbitrary unit) at a viewing angle with respect to a front viewing angle.

The color difference is a value of a difference of a color of a light at a viewing angle with respect to a color of a light at a front viewing angle. For example, the color differences at various viewing angles can be expressed as u'v' values with respect to red, green, blue and white colors at a viewing angle of 0 degree.

A curve A shows a color difference of an organic light emitting diode (OLED) display device without a microlens and a blue cholesteric liquid crystal (CLC) layer according to a comparison example, and a curve B shows a color difference of an OLED display device having a blue CLC layer without a microlens according to a comparison example. A curve C shows a color difference of an OLED display device having a microlens without a blue CLC layer according to a comparison example, and a curve D shows a color difference of an OLED display device having a microlens ML and a blue CLC layer 200 according to the first embodiment of the present disclosure.

As the viewing angle varies from 0 degree to 60 degree, a rate of change of the color difference of the curve B of the OLED display device having the blue CLC layer without the microlens sharply increases as compared with the curve A of the OLED display device without the blue CLC layer and the microlens and the curve C of the OLED display device having the microlens without the blue CLC layer. Since the recycled light by the blue CLC layer is emitted from a side surface of the OLED display device along a predetermined viewing angle, a color shift where a color moves from a long wavelength to a short wavelength according to increase of a viewing angle occurs.

For example, the color shift can occur such that the bluish image at the side viewing angle with respect to the front viewing angle is displayed by the OLED display device.

In the OLED display device having the blue CLC layer without the microlens, since the luminance of the blue colored light increases due to the blue CLC layer, the efficiency of a full color driving is improved. Although the color temperature increases, deterioration in display quality according to increase of the viewing angle occurs in the OLED display device having the blue CLC layer without the microlens.

The curve D having the microlens ML and the blue CLC layer 200 of the OLED display device 100 has the rate of change of the color difference similar to the curve A and C without the blue CLC layer. In the OLED display device 100 according to the first embodiment of the present disclosure, the light extraction efficiency is improved due to the microlens ML. Further, since the recycled light by the blue CLC layer 200 compensates the light emitted to the side surface direction of the OLED display device 100, the bluish phenomenon at the side viewing angle is improved.

When the OLED display device includes the blue CLC layer, a reflectance increases due to the recycled blue colored light and a visibility of a black color is deteriorated. In the OLED display device 100 according to the first embodiment of the present disclosure, the visibility of a black color is improved due to reduction in reflectance.

Figure 4:
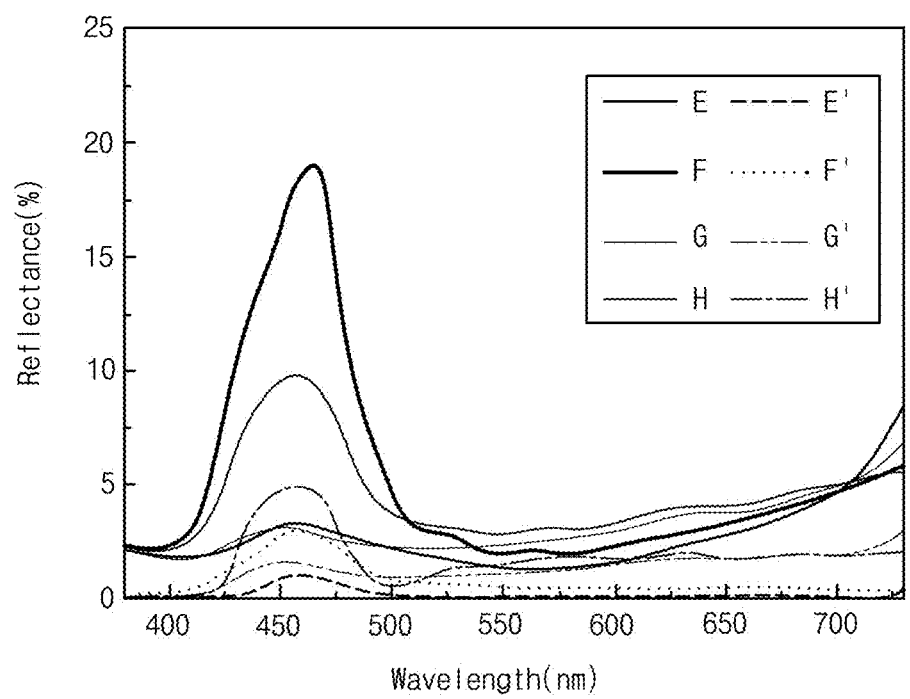
FIG. 4 is a graph showing a reflectance of an organic light emitting diode display device according to a first embodiment of the present disclosure.

FIG. 4 is a graph showing a reflectance of an organic light emitting diode display device according to a first embodiment of the present disclosure.

In FIG. 4, the x-axis represents a wavelength and the y-axis represents a total reflectance.

The total reflectance is a sum of a reflectance by a specular reflection and a reflectance by a diffuse reflection. The specular reflection is a ratio of a reflected light having a reflection angle with respect to an incident light having an incident angle equal to the reflection angle. The diffuse reflection is a ratio of a diffused light having various reflection angles with respect to an incident light having an incident angle.

In a specular component excluded (SCE) method, the reflectance is measured except for the light by the specular reflection. In a specular component included (SCI) method, the reflectance is measured including the light by the specular reflection for completing an integrating sphere.

In the SCE method, since the reflectance by the diffuse reflection is measured, the correlation of the color to the observer can be obtained and the color can be judged.

In the SCI method, since the reflectance by the specular reflection and the diffuse reflection is measured, the color can be judged without influence of a surface state.

A curve E and a curve E' show a reflectance by a SCI method and by SCE method, respectively, of an organic light emitting diode (OLED) display device without a microlens and a blue cholesteric liquid crystal (CLC) layer according to a comparison example. A curve F and a curve F' show a reflectance by a SCI method and by SCE method, respectively, of an OLED display device having a blue CLC layer without a microlens according to a comparison example.

A curve G and a curve G' show a reflectance by a SCI method and by SCE method, respectively, of an OLED display device having a microlens without a blue CLC layer according to a comparison example. A curve H and a curve H' show a reflectance by a SCI method and by SCE method, respectively, of an OLED display device 100 having a microlens and a blue CLC layer according to a first embodiment of the present disclosure.

The curve F at a wavelength of a blue color has a relatively high reflectance as compared with the curves E, G and H.

Since the OLED display device having a blue CLC layer without a microlens has a relatively high reflectance of a blue colored light, a visibility of a black color is deteriorated.

In the curve H of the OLED display device 100 having a microlens ML and a blue CLC layer 200 according to the first embodiment of the present disclosure, since the reflectance of a blue colored light is reduced, a visibility of a black color is improved.

In the OLED display device 100 according to a first embodiment of the present disclosure, the light extraction efficiency is improved due to the microlens ML and the efficiency in a full color driving is improved due to the blue CLC layer 200. Further, since the color temperature increases, deterioration in display quality due to increase in viewing angle is prevented. Moreover, the visibility of a black color is improved due to reduction in reflectance.

Figure 5:
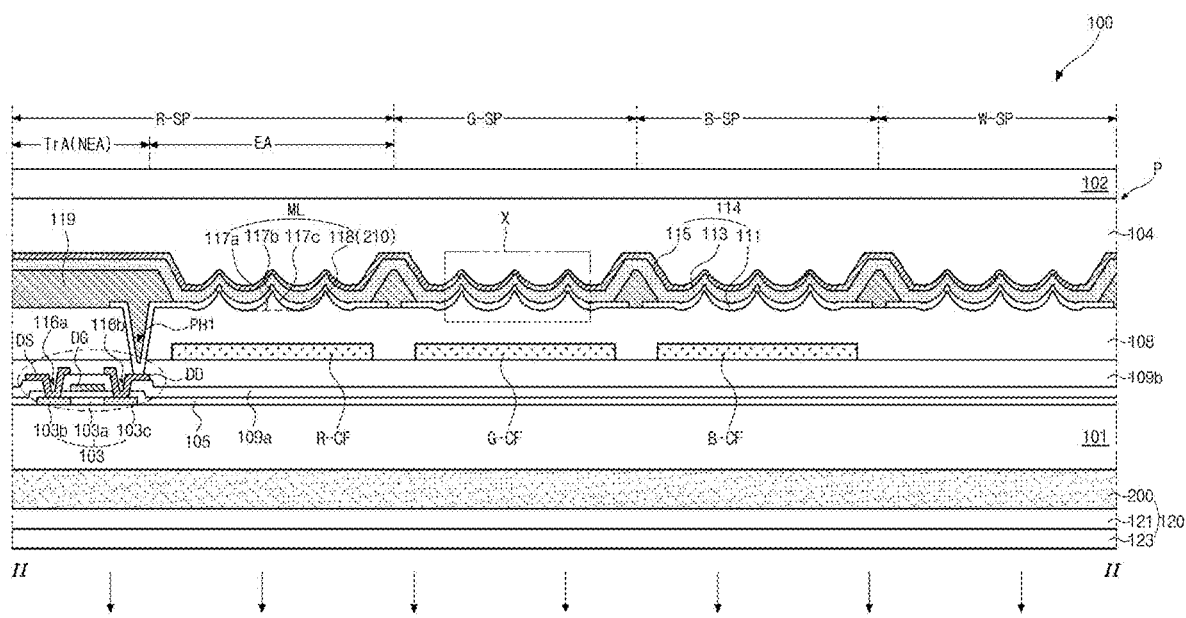
FIG. 5 is a cross-sectional view showing an organic light emitting diode display device according to a second embodiment of the present disclosure.
Figure 6:
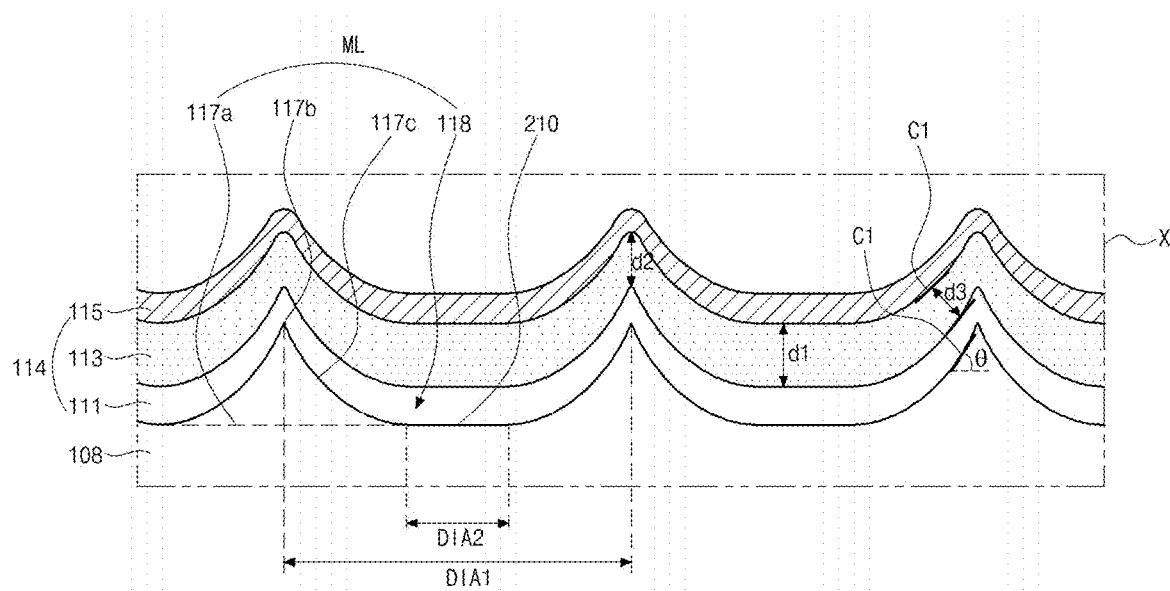
FIG. 6 is a magnified view showing a portion X of FIG. 5.
Figure 7:
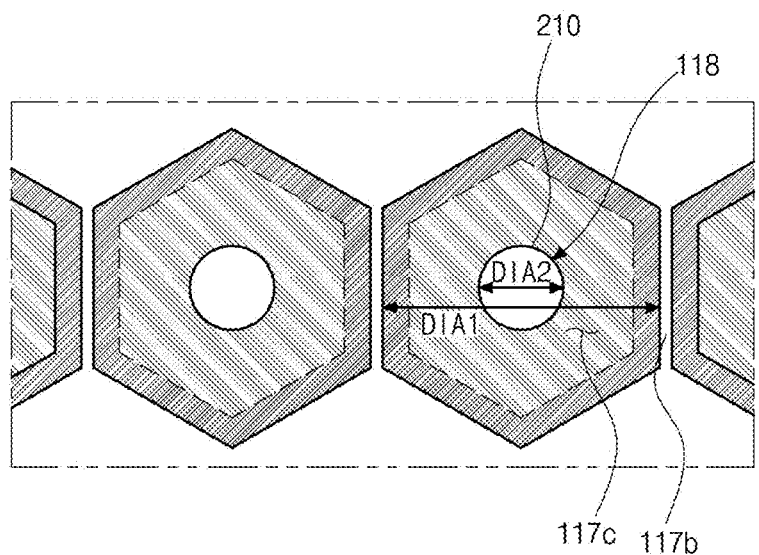
FIG. 7 is a plan view showing FIG. 6.

FIG. 5 is a cross-sectional view showing an organic light emitting diode display device according to a second embodiment of the present disclosure, FIG. 6 is a magnified view showing a portion X of FIG. 5, and FIG. 7 is a plan view showing FIG. 6.

A part of the second embodiment the same as a part of the first embodiment can be designated by the same reference number.

In FIGS. 5, 6 and 7, an organic light emitting diode (OLED) display device 100 includes a substrate 101 having a driving thin film transistor (TFT) DTr and a light emitting diode 114 and a protecting film 102 encapsulating the substrate 101.

The driving TFT DTr are disposed in a switching area of a non-emitting area NEA of each of the red, green, blue and white sub-pixels R-SP, G-SP, B-SP and W-SP. The driving TFT DTr includes source and drain electrodes DS and DD, a semiconductor layer 103 having an active region 103a and source and drain regions 103b and 103c connected to the source and drain electrodes DS and DD, respectively, a gate insulating layer 105 on the semiconductor layer 103 and a gate electrode DG on the gate insulating layer 105.

A first interlayer insulating layer 109a is disposed on the gate electrode DG. The first interlayer insulating layer 109a and the gate insulating layer 105 include first and second semiconductor contact holes 116a and 116b exposing the source and drain regions 103b and 103c, respectively, at both sides of the active region 103a.

A second interlayer insulating layer 109b is disposed on the source and drain electrodes DS and DD. Red, green and blue wavelength converting layers R-CF, G-CF and B-CF are disposed on the second interlayer insulating layer 109b in an emitting area EA of the red, green and blue sub-pixels R-SP, G-SP and B-SP, respectively.

The red, green and blue wavelength converting layers R-CF, G-CF and B-CF can convert a color of a white light emitted from a light emitting layer 113. For example, the red, green and blue color filters R-CF, G-CF and B-CF can be disposed in the red, green and blue sub-pixels R-SP, G-SP and B-SP, respectively. The wavelength converting layer is not disposed in the white sub-pixel W-SP, and a white light from the light emitting layer 113 can intactly pass through the white sub-pixel W-SP.

An overcoating layer 108 which has a drain contact hole PH1 exposing the drain electrode DD with the second interlayer insulating layer 109b is disposed on the red, green and blue wavelength converting layers R-CF, G-CF and B-CF. The overcoating layer 108 has a plurality of convex portions 117 and a plurality of concave portions 118 on a top surface thereof. The plurality of convex portions 117 and the plurality of concave portions 118 are alternately disposed with each other to constitute a microlens ML.

The overcoating layer 108 can include an insulating material having a refractive index of 1.5. For example, the overcoating layer 108 can include one of acrylic resin, epoxy resin, phenol resin, polyamide resin, polyimide resin, unsaturated polyester resin, polyphenylene resin, polyphenylenesulfide resin, benzocyclobutene and photoresist. However, a material of the overcoating layer 108 is not limited thereto.

The plurality of convex portions 117 can have a structure to define or surround the plurality of concave portions 118, respectively, and can have a bottom surface portion 117a, a top surface portion 117b and a side surface portion 117c. In one embodiment, as best shown in FIG. 7, the side surface portion 117c encircles the concave portion 118.

The side surface portion 117c can be a whole of a slanted surface constituting the top surface portion 117b. A slope of the side surface portion 117c can increase from the bottom surface portion 117a to the top surface portion 117b such that the side surface portion 117c can have a maximum slope Smax at a portion adjacent to the top surface portion 117b.

Since a path of a light emitted from the light emitting layer 113 is changed toward the substrate 101 by the plurality of convex portions 117, the light extraction efficiency of the OLED display device 100 according to the second embodiment increases.

To further increase the light extraction efficiency of the light emitting layer 113, the convex portion 117 of the overcoating layer 108 can have a structure where the top surface portion 117b has a sharp shape. For example, the convex portion 117 can have a cross-section of triangle shape including a vertex corresponding to the top surface portion 117b, a bottom side corresponding to the bottom surface portion 117a and a hypotenuse corresponding to the side surface portion 117c.

An angle θ of the side surface portion 117c of the convex portion 117 of the overcoating layer 108 can gradually increase from the bottom surface portion 117a to the top surface portion 117b. The angle θ is defined as an angle between the tangential line C1 of the side surface portion 117c and a horizontal surface (i.e., the bottom surface portion 117a). The side surface portion 117c can have the maximum slope Smax when the angle θ becomes the maximum value. The slope can be defined by a tangent value of the angle (tan θ).

In the OLED display device 100 according to the second embodiment, since the light emitting layer 113 is disposed on the overcoating layer 108 constituting the microlens ML, the light emitting layer 113 can have different thicknesses d1, d2 and d3 in different regions. The light emitting layer 113 can be formed to have the different thicknesses d1, d2 and d3 corresponding to the convex portion 117 and the concave portion 118 of the microlens ML.

For example, the third thickness d3 of the light emitting layer 113 of the side surface portion 117c of the convex portion 117 of the microlens ML can be smaller than the first and second thicknesses d1 and d2 of the light emitting layer 113 of the concave portion 118 and the top surface portion 117b of the convex portion 117.

The third thickness d3 of the light emitting layer 113 of the side surface portion 117c of the convex portion 117 can gradually decrease from the bottom surface portion 117a to the top surface portion 117b.

Since the light emitting layer 113 is formed on the overcoating layer 108 having the microlens ML, the side surface portion 117c of the convex portion 117 of the overcoating layer 108 can have the angle θ gradually increasing from the bottom surface portion 117a to the top surface portion 117b. As a result, the third thickness d3 of the light emitting layer 113 of the side surface portion 117c are smaller than the first and second thicknesses d1 and d2 of the light emitting layer 113 of the concave portion 118 and the top surface portion 117b.

Since the angle θ of the side surface portion 117c gradually increases from the bottom surface portion 117a to the top surface portion 117b, the third thickness d3 of the light emitting layer 113 can vary in the side surface portion 117c.

In the OLED display device 100 according to the second embodiment, the concave portion 118 of the microlens ML includes a flat portion 210. The flat portion 210 can be parallel to the bottom surface portion 117a and can be a whole of the concave portion 118.

As a result, the bottom surface portions 117a of the convex portions 117 can be spaced apart from each other to form the flat portion 210, and the side surface portion 117c of the convex portion 117 can have an angle θ with respect to the flat portion 210.

A region including the microlens ML of the OLED display device 100 can have hexagonal shapes in a plan view. More specifically, in a plan view, the top surface portions 117b of the convex portion 117 of the overcoating layer 108 may form hexagonal shapes. For example, as shown in FIG. 7, the region including the microlens ML can have a hexagonal honeycomb structure in a plan view.

When a unit cell is defined to correspond to a first size and a first diameter DIA1 between the top surface portions 117b of the convex portions 117, a second diameter (or length) DIA2 corresponding to a second size of the flat portion 210 can be within a range of 1% to 25% of the first diameter DIA1 of the unit cell.

For example, when the first diameter DIA1 of the unit cell is 16 nm, the second diameter DIA2 of the flat portion 210 in the unit cell can be within 0.16 nm to 4 nm.

When the second diameter DIA2 of the flat portion 210 is greater than 25% of the first diameter DIA1 of the unit cell, the effect of the microlens ML is reduced.

In the OLED display device 100 including the microlens ML having the flat portion 210 in the concave portion 118 and the blue CLC layer 200, the light extraction efficiency is improved.

A first electrode 111 connected to the drain electrode DD of the driving TFT DTr is disposed on the overcoating layer 108 constituting the microlens ML. For example, the first electrode 111 can be an anode of the light emitting diode 114 and can include a material having a relatively high work function.

The first electrode 111 is disposed in each of the red, green, blue and white sub-pixels R-SP, G-SP, B-SP and W-SP, and the bank 119 is disposed between the first electrodes 111 in the adjacent sub-pixels R-SP, G-SP, B-SP and W-SP.

A light emitting layer 113 and a second electrode 115 are sequentially disposed on the first electrode 111. The first electrode 111, the light emitting layer 113 and the second electrode 115 can have a shape according to a morphology of the plurality of convex portions 117 and the plurality of concave portions 118 of the top surface of the overcoating layer 108 to constitute the microlens ML.

A protecting film 102 of a thin film type is disposed on the driving TFT DTr and the light emitting diode 114, and a face seal 104 is disposed between the light emitting diode 114 and the protecting film 102. The face seal 104 can include an organic material or an inorganic material which is transparent and has an adhesive property. The protecting film 102 and the substrate 101 can be attached to each other by the face seal 104 to encapsulate the OLED display device 100.

In the OLED display device 100 according to the second embodiment, a polarizing plate 120 for preventing reduction of a contrast ratio due to an external light can be disposed on an outer surface of the transparent substrate 101.

To block the external light, the polarizing plate 120 can include a circular polarizing plate having a retardation plate 121 and a linear polarizing plate 123. A blue cholesteric liquid crystal (CLC) layer 200 is disposed between the substrate 101 and the retardation plate 121.

The retardation plate 121 can include a quarter wave plate (QWP) having a retardation of λ/4. The linear polarizing plate 123 has a polarizing axis and linearly polarizes a non-polarized light along a polarizing axis. For example, the linear polarizing plate 123 can transmit a component of the non-polarized light parallel to the polarizing axis and can absorb a component of the non-polarized light not parallel to the polarizing axis. As a result, the non-polarized light becomes a linearly polarized light along the polarizing axis through the linear polarizing plate 123.

The blue CLC layer 200 has a layer structure similar to a smectic liquid crystal, and a long axis of a liquid crystal molecule is arranged in a horizontal surface similar to a nematic liquid crystal. The liquid crystal molecules each having a thin and long shape are disposed in a first horizontal surface such that long axes thereof are arranged along a first direction. In addition, the liquid crystal molecules are disposed in a second horizontal surface parallel to the first horizontal surface such that long axes thereof are arranged along a second direction different from the first direction. The long axes of the liquid crystal molecules rotate along a direction perpendicular to the first and second surface. As a result, the liquid crystal molecules have a helical structure.

The blue CLC layer 200 can selectively transmit or reflect a circularly polarized light of a blue colored light having a wavelength of 440 nm to 480 nm and can transmit a light of the other wavelength.

For example, the blue CLC layer 200 can selectively transmit one of the right-handed and left-handed circularly polarized lights of the blue colored light and can selectively reflect the other of the right-handed and left-handed circularly polarized lights of the blue colored light. In addition, the blue CLC layer 200 can intactly transmit the red, green and white colored lights.

The blue colored light reflected by the blue CLC layer 200 is recycled to increase a luminance, and the blue colored light passing through the blue CLC layer 200 has a polarization axis parallel to a transmission axis of the linear polarizing plate 123 to increase a transmittance.

In the OLED display device 100 according to the second embodiment, a light extraction efficiency increases due to the microlens ML. In addition, since the blue CLC layer 200 capable of recycling a blue colored light is disposed on an outer surface of the substrate 101, the luminance increases and the light extraction efficiency is further improved.

Figure 8:
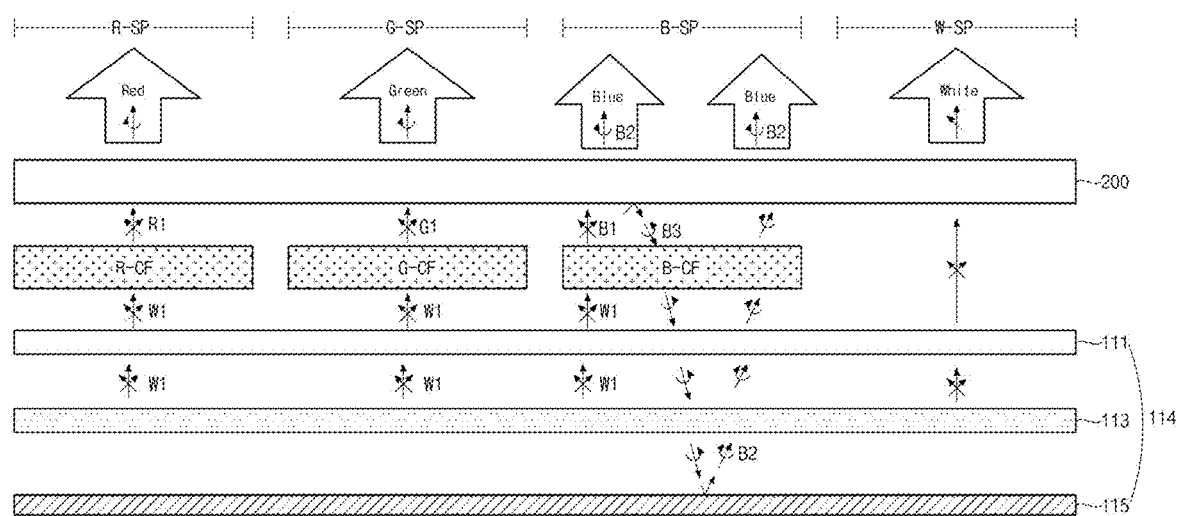
FIG. 8 is a cross-sectional view showing a state of a light in an organic light emitting diode display device according to a second embodiment of the present disclosure.

FIG. 8 is a cross-sectional view showing a state of a light in an organic light emitting diode display device according to a second embodiment of the present disclosure.

In FIG. 8, when a voltage is applied to the first and second electrodes 111 and 115 of the light emitting diode 114 of an organic light emitting diode (OLED) display device 100, a white colored light W1 having various components is emitted from the light emitting layer 113.

The white colored light W1 from the light emitting layer 113 passes through the first electrode 111 and enters the red, green and blue color filters R-CF, G-CF and B-CF in the red, green and blue sub-pixels R-SP, G-SP and B-SP, respectively. The white colored light W1 passing through the red, green and blue color filters R-CF, G-CF and B-CF is converted into the red, green and blue colored lights R1, G1 and B1, respectively.

The red, green and blue colored lights R1, G1 and B1 through the red, green and blue color filters R-CF, G-CF and B-CF enter the blue CLC layer 200 in the red, green and blue sub-pixels R-SP, G-SP and B-SP, and the white colored light W1 from the light emitting layer 113 enters the blue CLC layer 200.

The red, green and white colored lights R1, G1 and W1 pass through the blue CLC layer 200 in the red, green and white sub-pixels R-SP, G-SP and W-SP and are emitted to an exterior to display red, green and white colors in the red, green and white sub-pixels R-SP, G-SP and W-SP.

In the blue sub-pixel B-SP, a first circularly polarized light B2 (e.g., one of a right-handed circularly polarized light and a left-handed circularly polarized light) of the blue colored light B1 passes through the blue CLC layer 200 and is emitted to an exterior to display a blue color. As a result, the OLED display device 100 according to the second embodiment displays red, green, blue and white colors in the red, green, blue and white sub-pixels R-SP, G-SP, B-SP and W-SP, respectively, to obtain a full color of a high luminance.

A second circularly polarized light B3 (e.g., the other of a right-handed circularly polarized light and a left-handed circularly polarized light) of the blue colored light B1 does not pass through and is reflected by the blue CLC layer 200 and re-enters the light emitting diode 114.

The second circularly polarized light B3 is re-reflected and recycled by an element such as the second electrode 115 to be converted into the first circularly polarized light B2.

The first circularly polarized light B2 recycled in the light emitting diode 114 passes through the blue CLC layer 200 and is emitted to an exterior to display a blue color.

In the OLED display device 100 according to the second embodiment, a luminance of a blue colored light increases by recycling the blue colored light through the blue CLC layer 200.

As a result, the light extraction efficiency increases due to the microlens ML and the efficiency of the full color driving is improved due to the blue CLC layer 200. Further, the color temperature increases and deterioration in display quality according to increase in viewing angle is prevented.

Moreover, the visibility of a black color is improved due to reduction in reflectance.

Specifically, in the OLED display device 100 according to the second embodiment, the light extraction efficiency is further improved due to the blue colored light recycled by the blue CLC layer 200 as well as the microlens ML.

The recycle efficiency of the blue CLC layer 200 depends on the amount of the light reflected through the same optical path. In the OLED display device having the microlens without a flat portion, since the optical path is changed by the microlens ML of the first electrode 111, the light emitting layer 113 and the second electrode 115 of the light emitting diode 114, the recycle efficiency of the blue CLC layer 200 does not greatly increase.

Figure 9:
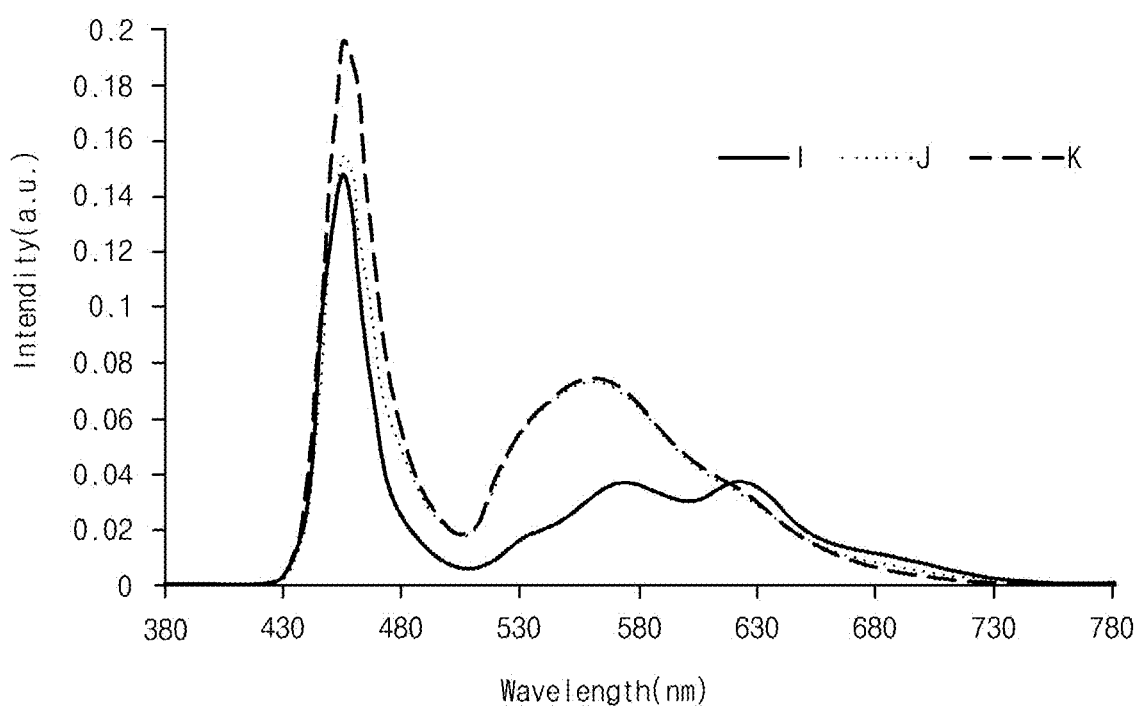
FIG. 9 is a graph showing a light extraction efficiency of an organic light emitting diode display device according to a second embodiment of the present disclosure.

FIG. 9 is a graph showing a light extraction efficiency of an organic light emitting diode display device according to a second embodiment of the present disclosure.

In FIG. 9, the x-axis represents a wavelength and the y-axis represents an intensity. A curve I shows an organic light emitting diode (OLED) display device having a microlens of no flat portion without a blue cholesteric liquid crystal (CLC) layer, a curve J shows an OLED display device having a microlens of no flat portion and a blue CLC layer, and a curve K shows an OLED display device 100 having a microlens ML of a flat portion 210 and a blue CLC layer 200 according to a second embodiment of the present disclosure.

The intensity is a relative value with respect to a maximum of an emission spectrum. For example, the emission spectrum of the yellow-green color can be expressed with respect to 0.34 of the maximum emission spectrum of the blue color.

Although the curve J has the intensity of the emission spectrum of the yellow-green color greater than the curve I, the curve J has the intensity of the emission spectrum of the blue color similar to the curve I.

Since the curve J has the intensity of the emission spectrum of the yellow-green color greater than the curve I, the color viewing angle and the color reproducibility according to the viewing angle of the curve J due to the efficiency difference of the color are improved as compared with the curve I. However, since the curve J has the intensity of the emission spectrum of the blue color similar to the curve I, the light extraction efficiency of the curve J is not greatly improved as compared with the curve I.

As a result, in the OLED display device having the microlens of no flat portion and the blue CLC layer, the light extraction efficiency is not greatly improved.

The curve K corresponding to the OLED display device 100 having the microlens of a flat portion 210 and the blue CLC layer 200 according to the second embodiment has the intensity of the emission spectrum of the yellow-green color greater than the curve I and the intensity of the emission spectrum of the blue color greater than the curve J.

For example, the curve K can have the intensity of the emission spectrum of the blue color greater than the curve J by 25%.

In the OLED display device 100 having the microlens ML of a flat portion 210 and the blue CLC layer 200 according to the second embodiment, since the amount of the light reflected through the same optical path of the blue CLC layer 200 increases due to the flat portion 210, the recycle efficiency increases.

Figure 10:
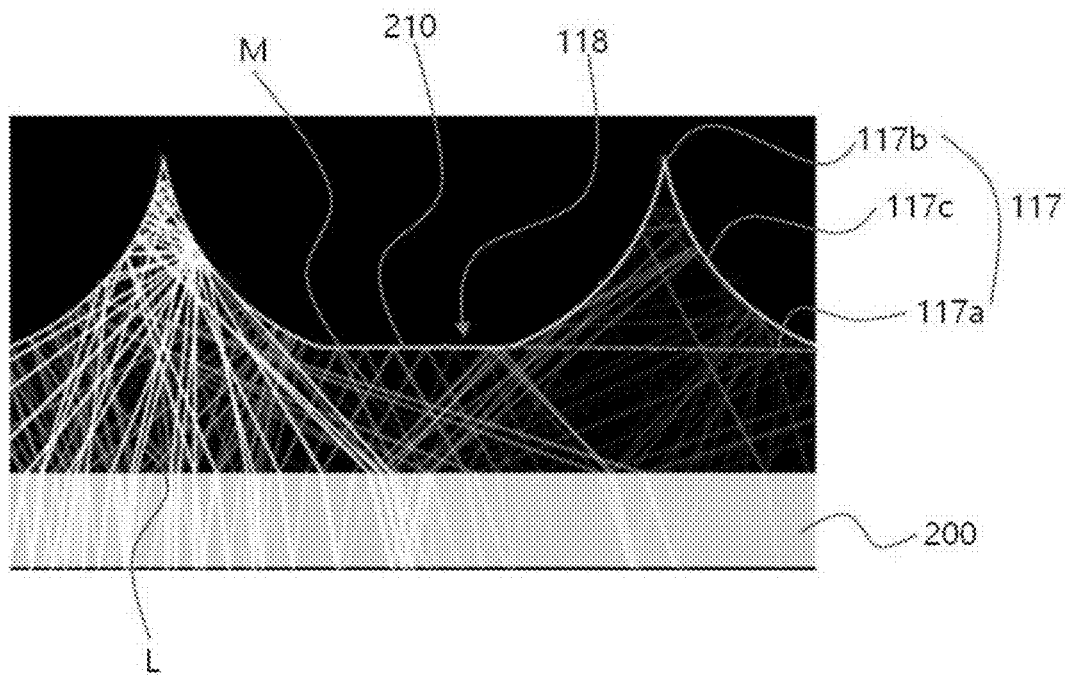
FIG. 10 is a view showing a simulation result of a recycling in an organic light emitting diode according to a second embodiment of the present disclosure.

FIG. 10 is a view showing a simulation result of a recycling in an organic light emitting diode according to a second embodiment of the present disclosure.

In FIG. 10, a light reflected by a blue cholesteric liquid crystal (CLC) layer 200 re-enters a light emitting diode 114. The light is reflected by a side surface portion 117c of a convex portion 117 of a first electrode 111, a light emitting layer 113 and a second electrode 115 constituting a microlens ML to become first lights L having different optical paths, and the light is reflected by a flat portion 210 of a concave portion 118 of the microlens ML to become second lights M having similar optical paths.

As a result, in the OLED display device 100 according to the second embodiment, the light extraction efficiency increases due to the microlens ML. Since the blue CLC layer 200 recycling the blue colored light is disposed on the outer surface of the substrate 101, the luminance of the blue colored light having a relatively short wavelength as compared with the other colored light increases and the efficiency of the full color driving also increases.

Further, since the luminance of the blue colored light increases, the color temperature of the OLED display device 100 increases and the image having the relatively high display quality is displayed. Moreover, deterioration in display quality according to increase in viewing angle is prevented by the blue CLC layer 200.

In the OLED display device having the blue CLC layer without the microlens, since the reflectance of the blue colored light increases, the visibility of a black color can be deteriorated. In the OLED display device 100 according to the second embodiment, the visibility of a black color is improved due to reduction in reflectance.

Specifically, in the OLED display device 100 having the microlens ML of the flat portion 210 of the concave portion 118 and the blue CLC layer 200 according to the second embodiment, since the luminance of the blue colored light recycled by the blue CLC layer 200 increases due to the flat portion 210, the total luminance of the OLED display device 100 also increases.

As a result, in the OLED display device 100 according to the second embodiment, the light extraction efficiency is improved and the lifetime is extended.

Figure 11:
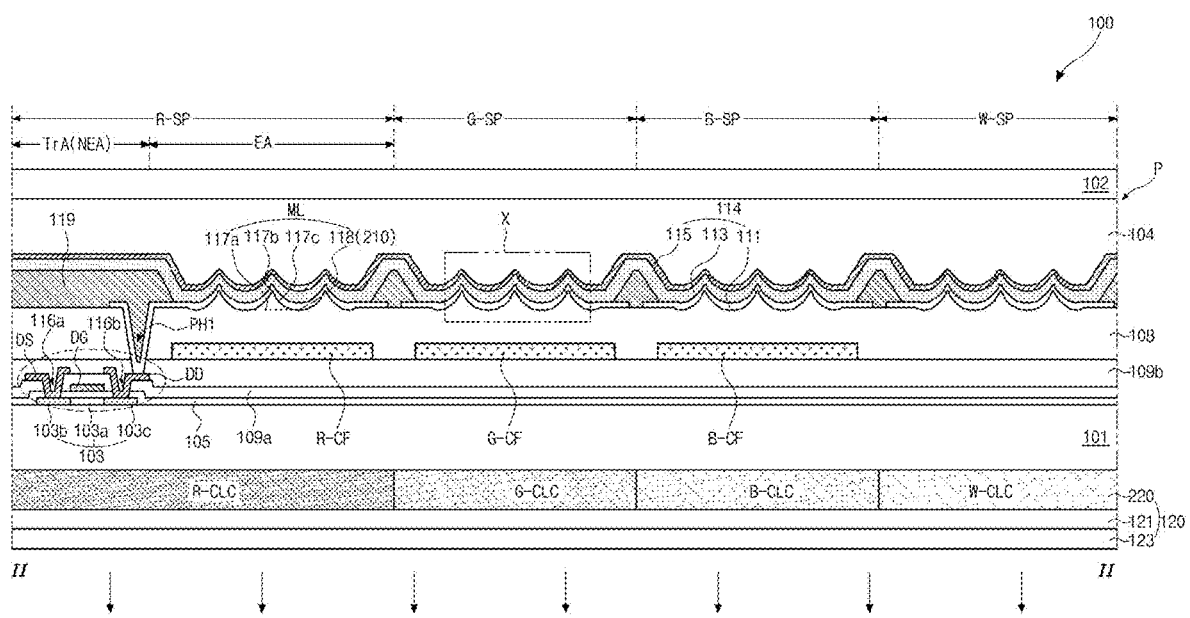
FIG. 11 is a cross-sectional view showing an organic light emitting diode display device according to a third embodiment of the present disclosure.

FIG. 11 is a cross-sectional view showing an organic light emitting diode display device according to a third embodiment of the present disclosure.

A part of the third embodiment the same as a part of the first and second embodiments can be designated by the same reference number.

In FIG. 11, an organic light emitting diode (OLED) display device 100 includes a substrate 101 having a driving thin film transistor (TFT) DTr and a light emitting diode 114 and a protecting film 102 encapsulating the substrate 101.

The driving TFT DTr are disposed in a switching area of a non-emitting area NEA of each of the red, green, blue and white sub-pixels R-SP, G-SP, B-SP and W-SP. The driving TFT DTr includes source and drain electrodes DS and DD, a semiconductor layer 103 having an active region 103a and source and drain regions 103b and 103c connected to the source and drain electrodes DS and DD, respectively, a gate insulating layer 105 on the semiconductor layer 103 and a gate electrode DG on the gate insulating layer 105.

A first interlayer insulating layer 109a is disposed on the gate electrode DG. The first interlayer insulating layer 109a and the gate insulating layer 105 include first and second semiconductor contact holes 116a and 116b exposing the source and drain regions 103b and 103c, respectively, at both sides of the active region 103a.

A second interlayer insulating layer 109b is disposed on the source and drain electrodes DS and DD. Red, green and blue wavelength converting layers R-CF, G-CF and B-CF are disposed on the second interlayer insulating layer 109b in an emitting area EA of the red, green and blue sub-pixels R-SP, G-SP and B-SP, respectively.

The red, green and blue wavelength converting layers R-CF, G-CF and B-CF can convert a color of a white light emitted from a light emitting layer 113. For example, the red, green and blue color filters R-CF, G-CF and B-CF can be disposed in the red, green and blue sub-pixels R-SP, G-SP and B-SP, respectively. The wavelength converting layer is not disposed in the white sub-pixel W-SP, and a white light from the light emitting layer 113 can intactly pass through the white sub-pixel W-SP.

An overcoating layer 108 which has a drain contact hole PH1 exposing the drain electrode DD with the second interlayer insulating layer 109b is disposed on the red, green and blue wavelength converting layers R-CF, G-CF and B-CF. The overcoating layer 108 has a plurality of convex portions 117 and a plurality of concave portions 118 on a top surface thereof. The plurality of convex portions 117 and the plurality of concave portions 118 are alternately disposed with each other to constitute a microlens ML.

The overcoating layer 108 can include an insulating material having a refractive index of 1.5. For example, the overcoating layer 108 can include one of acrylic resin, epoxy resin, phenol resin, polyamide resin, polyimide resin, unsaturated polyester resin, polyphenylene resin, polyphenylenesulfide resin, benzocyclobutene and photoresist. However, a material of the overcoating layer 108 is not limited thereto.

The plurality of convex portions 117 can have a structure to define or surround the plurality of concave portions 118, respectively, and can have a bottom surface portion 117a, a top surface portion 117b and a side surface portion 117c.

The side surface portion 117c can be a whole of a slanted surface constituting the top surface portion 117b. A slope of the side surface portion 117c can increase from the bottom surface portion 117a to the top surface portion 117b such that the side surface portion 117c can have a maximum slope Smax at a portion adjacent to the top surface portion 117b.

Since a path of a light emitted from the light emitting layer 113 is changed toward the substrate 101 by the plurality of convex portions 117, the light extraction efficiency of the OLED display device 100 according to the third embodiment increases.

To further increase the light extraction efficiency of the light emitting layer 113, the convex portion 117 of the overcoating layer 108 can have a structure where the top surface portion 117b has a sharp shape. For example, the convex portion 117 can have a cross-section of triangle shape including a vertex corresponding to the top surface portion 117b, a bottom side corresponding to the bottom surface portion 117a and a hypotenuse corresponding to the side surface portion 117c.

An angle θ (of FIG. 6) of the side surface portion 117c of the convex portion 117 of the overcoating layer 108 can gradually increase from the bottom surface portion 117a to the top surface portion 117b. The angle θ is defined as an angle between the tangential line C1 of the side surface portion 117c and a horizontal surface (i.e., the bottom surface portion 117a). The side surface portion 117c can have the maximum slope Smax when the angle θ becomes the maximum value. The slope can be defined by a tangent value of the angle (tan θ).

In the OLED display device 100 according to the third embodiment, since the light emitting layer 113 is disposed on the overcoating layer 108 constituting the microlens ML, the light emitting layer 113 can have different thicknesses d1, d2 and d3 (of FIG. 6) in different regions. The light emitting layer 113 can be formed to have the different thicknesses d1, d2 and d3 corresponding to the convex portion 117 and the concave portion 118 of the microlens ML.

For example, the third thickness d3 of the light emitting layer 113 of the side surface portion 117c of the convex portion 117 of the microlens ML can be smaller than the first and second thicknesses d1 and d2 of the light emitting layer 113 of the concave portion 118 and the top surface portion 117b of the convex portion 117.

The third thickness d3 of the light emitting layer 113 of the side surface portion 117c of the convex portion 117 can gradually decrease from the bottom surface portion 117a to the top surface portion 117b.

Since the light emitting layer 113 is formed on the overcoating layer 108 having the microlens ML, the side surface portion 117c of the convex portion 117 of the overcoating layer 108 can have the angle θ gradually increasing from the bottom surface portion 117a to the top surface portion 117b. As a result, the third thickness d3 of the light emitting layer 113 of the side surface portion 117c are smaller than the first and second thicknesses d1 and d2 of the light emitting layer 113 of the concave portion 118 and the top surface portion 117b.

Since the angle θ of the side surface portion 117c gradually increases from the bottom surface portion 117a to the top surface portion 117b, the third thickness d3 of the light emitting layer 113 can vary in the side surface portion 117c.

In the OLED display device 100 according to the third embodiment, the concave portion 118 of the microlens ML includes a flat portion 210. The flat portion 210 can be parallel to the bottom surface portion 117a and can be a whole of the concave portion 118.

As a result, the bottom surface portions 117a of the convex portions 117 can be spaced apart from each other to form the flat portion 210, and the side surface portion 117c of the convex portion 117 can have an angle θ with respect to the flat portion 210.

When a unit cell is defined to correspond to a first size and a first diameter DIA1 (of FIG. 6) between the top surface portions 117b of the convex portions 117, a second diameter DIA2 (of FIG. 6) corresponding to a second size of the flat portion 210 can be within a range of 1% to 25% of the first diameter DIA1 of the unit cell.

For example, when the first diameter DIA1 of the unit cell is 16 nm, the second diameter DIA2 of the flat portion 210 in the unit cell can be within 0.16 nm to 4 nm.

When the second diameter DIA2 of the flat portion 210 is greater than 25% of the first diameter DIA1 of the unit cell, the effect of the microlens ML is reduced.

In the OLED display device 100 including the microlens ML having the flat portion 210 in the concave portion 118 and the blue CLC layer 200, the light extraction efficiency is improved.

A first electrode 111 connected to the drain electrode DD of the driving TFT DTr is disposed on the overcoating layer 108 constituting the microlens ML. For example, the first electrode 111 can be an anode of the light emitting diode 114 and can include a material having a relatively high work function.

The first electrode 111 is disposed in each of the red, green, blue and white sub-pixels R-SP, G-SP, B-SP and W-SP, and the bank 119 is disposed between the first electrodes 111 in the adjacent sub-pixels R-SP, G-SP, B-SP and W-SP.

A light emitting layer 113 and a second electrode 115 are sequentially disposed on the first electrode 111. The first electrode 111, the light emitting layer 113 and the second electrode 115 can have a shape according to a morphology of the plurality of convex portions 117 and the plurality of concave portions 118 of the top surface of the overcoating layer 108 to constitute the microlens ML.

A protecting film 102 of a thin film type is disposed on the driving TFT DTr and the light emitting diode 114, and a face seal 104 is disposed between the light emitting diode 114 and the protecting film 102. The face seal 104 can include an organic material or an inorganic material which is transparent and has an adhesive property. The protecting film 102 and the substrate 101 can be attached to each other by the face seal 104 to encapsulate the OLED display device 100.

In the OLED display device 100 according to the third embodiment, a polarizing plate 120 for preventing reduction of a contrast ratio due to an external light can be disposed on an outer surface of the transparent substrate 101.

To block the external light, the polarizing plate 120 can include a circular polarizing plate having a retardation plate 121 and a linear polarizing plate 123. A cholesteric liquid crystal (CLC) layer 220 is disposed between the substrate 101 and the retardation plate 121.

The retardation plate 121 can include a quarter wave plate (QWP) having a retardation of λ/4. The linear polarizing plate 123 has a polarizing axis and linearly polarizes a non-polarized light along a polarizing axis. For example, the linear polarizing plate 123 can transmit a component of the non-polarized light parallel to the polarizing axis and can absorb a component of the non-polarized light not parallel to the polarizing axis. As a result, the non-polarized light becomes a linearly polarized light along the polarizing axis through the linear polarizing plate 123.

The CLC layer 220 includes red, green, blue and white CLC layers R-CLC, G-CLC, B-CLC and W-CLC in the red, green, blue and white sub-pixels R-SP, G-SP, B-SP and W-SP, respectively.

Each of the red, green, blue and white CLC layers R-CLC, G-CLC, B-CLC and W-CLC has a layer structure similar to a smectic liquid crystal, and a long axis of a liquid crystal molecule is arranged in a horizontal surface similar to a nematic liquid crystal. The liquid crystal molecules each having a thin and long shape are disposed in a first horizontal surface such that long axes thereof are arranged along a first direction. In addition, the liquid crystal molecules are disposed in a second horizontal surface parallel to the first horizontal surface such that long axes thereof are arranged along a second direction different from the first direction. The long axes of the liquid crystal molecules rotate along a direction perpendicular to the first and second surface. As a result, the liquid crystal molecules have a helical structure.

When a pitch is defined as a distance where an optical axis of the liquid crystal molecule rotates by 360 degree, a reflection wavelength of the CLC layer 220 can be adjusted by the pitch of the liquid crystal molecule.

For example, the red CLC layer R-CLC in the red sub-pixel R-SP can selectively transmit or reflect a circularly polarized light of a red colored light having a wavelength of 650 nm to 720 nm and can transmit a light of the other wavelength. The green CLC layer G-CLC in the green sub-pixel G-SP can selectively transmit or reflect a circularly polarized light of a green colored light having a wavelength of 490 nm to 575 nm and can transmit a light of the other wavelength.

The blue CLC layer B-CLC in the blue sub-pixel B-SP can selectively transmit or reflect a circularly polarized light of a blue colored light having a wavelength of 440 nm to 480 nm and can transmit a light of the other wavelength. The white CLC layer W-CLC in the white sub-pixel W-SP can selectively transmit or reflect a circularly polarized light of a white colored light having a wavelength of 365 nm to 720 nm and can transmit a light of the other wavelength.

Each of the red, green, blue and white CLC layers R-CLC, G-CLC, B-CLC and W-CLC can selectively transmit one of the right-handed and left-handed circularly polarized lights and can selectively reflect the other of the right-handed and left-handed circularly polarized lights.

Red, green, blue and white colored lights reflected by the red, green, blue and white CLC layers R-CLC, G-CLC, B-CLC and W-CLC are recycled to increase a luminance, and the red, green, blue and white colored lights passing through the red, green, blue and white CLC layers R-CLC, G-CLC, B-CLC and W-CLC have a polarization axis parallel to a transmission axis of the linear polarizing plate 123 to increase a transmittance.

In the OLED display device 100 according to the third embodiment, a light extraction efficiency increases due to the microlens ML. In addition, since the red, green, blue and white CLC layers R-CLC, G-CLC, B-CLC and W-CLC capable of recycling red, green, blue and white colored lights are disposed in the red, green, blue and white sub-pixels R-SP, G-SP, B-SP and W-SP, respectively, on an outer surface of the substrate 101, the luminance increases and the light extraction efficiency is further improved.

Figure 12:
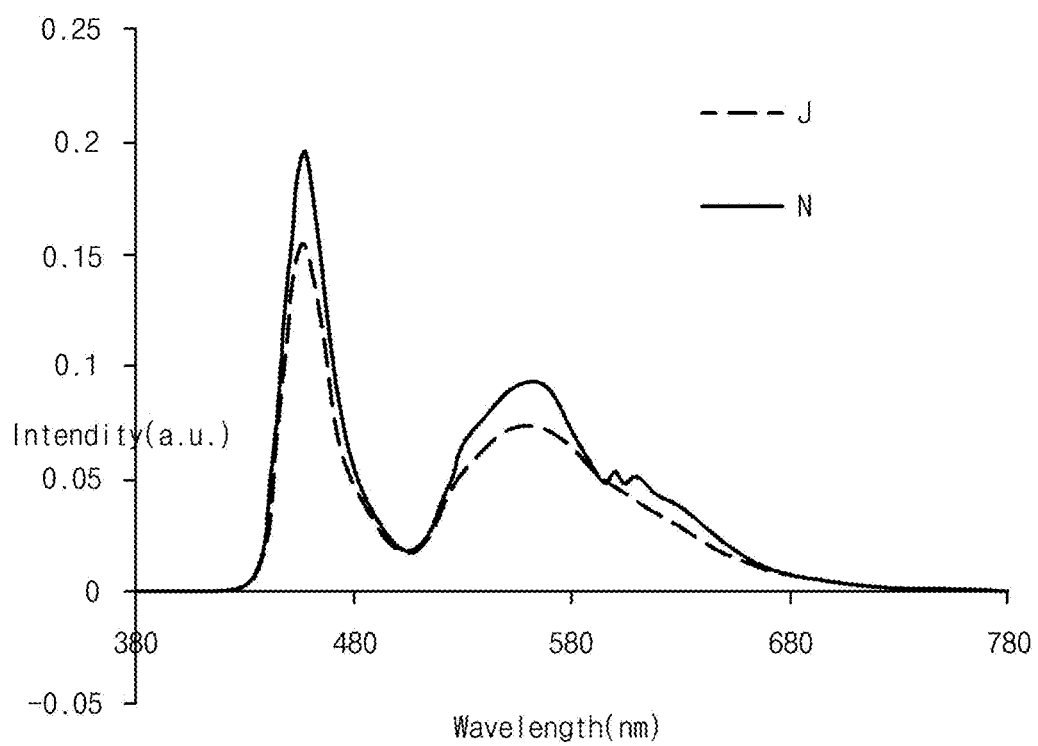
FIG. 12 is a graph showing a light extraction efficiency of an organic light emitting diode display device according to a third embodiment of the present disclosure.

FIG. 12 is a graph showing a light extraction efficiency of an organic light emitting diode display device according to a third embodiment of the present disclosure.

In FIG. 12, the x-axis represents a wavelength and the y-axis represents an intensity. A curve J shows an OLED display device having a microlens of no flat portion and a blue CLC layer, and a curve N shows an OLED display device 100 having a microlens ML of a flat portion 210 and red, green, blue and white CLC layers R-CLC, G-CLC, B-CLC and W-CLC according to a third embodiment of the present disclosure.

The intensity is a relative value with respect to a maximum of an emission spectrum. For example, the emission spectrum of the yellow-green color can be expressed with respect to 0.34 of the maximum emission spectrum of the blue color.

The curve N has the intensities of the emission spectrums of the yellow-green and blue colors greater than the curve J.

In FIGS. 9 and 12, while the curve N has the intensity of the emission spectrum of the blue color similar to the curve K, the curve N has the intensity of the emission spectrum of the yellow-green color greater than the curve K.

Since the OLED display device 100 according to the third embodiment includes the flat portion 210 of the concave portion 118 of the microlens ML, the amount of the light reflected through the same optical path of the CLC layer 220 increases and the recycle efficiency increases. As a result, the curve N has the intensities greater than the curve J in the emission spectrums of both of the yellow-green color and the blue color.

Further, in the OLED display device 100 according to the third embodiment, since all of the red, green and white colored lights are recycled in the red, green and white sub-pixels R-SP, G-SP and W-SP, the curve N has the intensity greater than the curve K where only the blue colored light is recycled in the emission spectrum of the yellow-green color.

Since the OLED display device 100 according to the third embodiment has relatively high intensities in the emission spectrum of the blue and yellow-green colors, the light extraction efficiency increases. In addition, since the OLED display device 100 according to the third embodiment has relatively high intensities in the emission spectrum of the yellow-green color, the color viewing angle and the color reproducibility according to the viewing angle also increase.

In the OLED display device 100 according to the third embodiment, the light extraction efficiency increases due to the microlens ML. Since the red, green, blue and white CLC layers R-CLC, G-CLC, B-CLC and W-CLC recycling all of the red, green, blue and white colored lights are disposed on the outer surface of the substrate 101, the luminance of the red, green, blue and white colored lights increases and the efficiency of the full color driving also increases.

Further, since the luminance of the blue colored light increases, the color temperature of the OLED display device 100 increases and the image having the relatively high display quality is displayed. Moreover, deterioration in display quality according to increase in viewing angle is prevented by the red, green, blue and white CLC layers R-CLC, G-CLC, B-CLC and W-CLC.

In the OLED display device having the blue CLC layer without the microlens, since the reflectance of the blue colored light increases, the visibility of a black color can be deteriorated. In the OLED display device 100 according to the third embodiment, the visibility of a black color is improved due to reduction in reflectance.

Specifically, in the OLED display device 100 having the microlens ML of the flat portion 210 of the concave portion 118 and the CLC layer 220 according to the third embodiment, since the luminance of the red, green, blue and white colored lights recycled by the red, green, blue and white CLC layers R-CLC, G-CLC, B-CLC and W-CLC increases due to the flat portion 210, the total luminance of the OLED display device 100 also increases.

As a result, in the OLED display device 100 according to the third embodiment, the light extraction efficiency of is improved and the lifetime is extended.

Further, since the intensity of the emission spectrum of the yellow-green color increases, the color viewing angle and the color reproducibility according to the viewing angle also increase.

Although the red, green, blue and white CLC layers R-CLC, G-CLC, B-CLC and W-CLC are disposed between the substrate 101 and the retardation plate 121 in the third embodiment, the red, green, blue and white CLC layers R-CLC, G-CLC, B-CLC and W-CLC can be disposed at any position of the path of the white light from the light emitting layer 113 after passing through the red, green and blue color filters R-CF, G-CF and B-CF in another embodiment.

When the light emitting layer 113 directly emits the red, green, blue and white colored lights in another embodiment, the red, green, blue and white CLC layers R-CLC, G-CLC, B-CLC and W-CLC can be disposed at any position of the path of the red, green, blue and white colored lights.

Further, a black matrix or a bank can be disposed among the red, green, blue and white CLC layers R-CLC, G-CLC, B-CLC and W-CLC in the red, green, blue and white sub-pixels R-SP, G-SP, B-SP and W-SP, respectively, in another embodiment to prevent the light reflected by the red, green, blue and white CLC layers R-CLC, G-CLC, B-CLC and W-CLC from entering the adjacent sub-pixel.

The present disclosure also relates to and is not limited to the following aspects.

In the present disclosure, an organic light emitting diode display device includes: a substrate having an emitting area and a non-emitting area; an overcoating layer on a first surface of the substrate and including a plurality of convex portions and a plurality of concave portions, at least one of the plurality of convex portions including a bottom surface portion, a top surface portion and a side surface portion between the bottom and top surface portions; a light emitting diode on the overcoating layer; and a cholesteric liquid crystal layer at a transmission direction of a light emitted from the light emitting diode.

In the present disclosure, at least one of the plurality of concave portions includes a flat portion.

In the present disclosure, a diameter of the flat portion is within a range of 1% to 25% of a diameter between the top surface portions of adjacent two of the plurality of convex portions.

In the present disclosure, the substrate includes red, green, blue and white sub-pixels, the light emitting diode emits red, green, blue and white colored lights in the red, green, blue and white sub-pixels, respectively, and the cholesteric liquid crystal layer selectively reflects the blue colored light having a wavelength within a range of 440 nm to 480 nm.

In the present disclosure, the substrate includes red, green, blue and white sub-pixels, the light emitting diode emits red, green, blue and white colored lights in the red, green, blue and white sub-pixels, respectively, the cholesteric liquid crystal layer includes red, green, blue and white cholesteric liquid crystal layers in the red, green, blue and white sub-pixels, respectively, the red cholesteric liquid crystal layer selectively reflects the red colored light having a wavelength within a range of 650 nm to 720 nm, the green cholesteric liquid crystal layer selectively reflects the green colored light having a wavelength within a range of 490 nm to 575 nm, the blue cholesteric liquid crystal layer selectively reflects the blue colored light having a wavelength within a range of 440 nm to 480 nm, and the white cholesteric liquid crystal layer selectively reflects the white colored light having a wavelength within a range of 365 nm to 720 nm.

In the present disclosure, the organic light emitting diode display device further includes a retardation plate and a linear polarizing plate sequentially on a second surface of the substrate.

In the present disclosure, the cholesteric liquid crystal layer is disposed between the light emitting diode and the retardation plate.

In the present disclosure, a slope of the side surface portion increases from the bottom surface portion to the top surface portion.

In the present disclosure, the light emitting diode includes a first electrode on the overcoating layer, a light emitting layer on the first electrode and a second electrode on the light emitting layer.

In the present disclosure, wherein a thickness of the light emitting layer on the side surface portion is smaller than a thickness of the light emitting layer on the plurality of concave portions.

In the present disclosure, the organic light emitting diode display device further includes a wavelength converting layer interposed between the substrate and the overcoating layer, and an edge portion of the wavelength converting layer extends beyond an edge portion of the plurality of convex portions and the plurality of concave portions toward the non-emitting area.

In the present disclosure, the organic light emitting diode display device further includes a bank over the overcoating layer and including an opening exposing the first electrode, and the plurality of convex portions and the plurality of concave portions are formed in the opening.

In the present disclosure, the plurality of convex portions and the plurality of concave portions contact an edge portion of the bank.

In the present disclosure, the bank overlays an edge portion of the convex portions and the plurality of concave portions.

In the present disclosure, an edge portion of the wavelength converting layer, an edge portion of the plurality of convex portions and the plurality of concave portions and an edge portion of the bank overlap one another in the non-emitting area.

In the present disclosure, a border portion of the emitting area and the non-emitting area overlaps an edge portion of the plurality of convex portions and the plurality of concave portions.

In the present disclosure, the convex portion constitutes one of a hexagonal shape and a honeycomb structure in a plan view.

It will be apparent to those skilled in the art that various modifications and variations can be made to the various embodiments of the present disclosure without departing from the spirit or scope of the present disclosure. Thus, it is intended that the present disclosure cover the modifications and variations of the various embodiments of the present disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode display device, comprising:
    a substrate having an emitting area and a non-emitting area, the substrate having a first surface and a second surface;
    an overcoating layer on the first surface of the substrate and including a plurality of convex portions and a plurality of concave portions, at least one of the plurality of convex portions including a bottom surface portion, a top surface portion, and a side surface portion between the bottom and top surface portions;
    a light emitting diode on the overcoating layer; and
    a cholesteric liquid crystal layer on the second surface of the substrate in a transmission direction of a light emitted from the light emitting diode having a flat portion at locations corresponding to the plurality of concave portions,
    wherein the flat portion is substantially parallel to the substrate, and
    wherein a diameter of the flat portion is within a range of 1% to 25% of a diameter between the top surface portions of adjacent two of the plurality of convex portions.

2. The organic light emitting diode display device of claim 1, wherein the substrate includes red, green, blue, and white sub-pixels,
    wherein the light emitting diode emits red, green, blue, and white colored lights in the red, green, blue and white sub-pixels, respectively, and
    wherein the cholesteric liquid crystal layer selectively reflects the blue colored light having a wavelength within a range of 440 nm to 480 nm.

3. The organic light emitting diode display device of claim 1, wherein the substrate includes red, green, blue, and white sub-pixels,
    wherein the light emitting diode emits red, green, blue, and white colored lights in the red, green, blue and white sub-pixels, respectively, wherein the cholesteric liquid crystal layer includes red, green, blue, and white cholesteric liquid crystal layers in the red, green, blue and white sub-pixels, respectively, wherein the red cholesteric liquid crystal layer selectively reflects the red colored light having a wavelength within a range of 650 nm to 720 nm, wherein the green cholesteric liquid crystal layer selectively reflects the green colored light having a wavelength within a range of 490 nm to 575 nm, wherein the blue cholesteric liquid crystal layer selectively reflects the blue colored light having a wavelength within a range of 440 nm to 480 nm, and wherein the white cholesteric liquid crystal layer selectively reflects the white colored light having a wavelength within a range of 365 nm to 720 nm.

4. The organic light emitting diode display device of claim 1, further comprising a retardation plate and a linear polarizing plate sequentially on a second surface of the substrate.

5. The organic light emitting diode display device of claim 4, wherein the cholesteric liquid crystal layer is disposed between the light emitting diode and the retardation plate.

6. The organic light emitting diode display device of claim 1, wherein a slope of the side surface portion increases from the bottom surface portion to the top surface portion.

7. The organic light emitting diode display device of claim 1, wherein the light emitting diode includes a first electrode on the overcoating layer, a light emitting layer on the first electrode and a second electrode on the light emitting layer.

8. The organic light emitting diode display device of claim 7, wherein a thickness of the light emitting layer on the side surface portion is smaller than a thickness of the light emitting layer on the plurality of concave portions.

9. The organic light emitting diode display device of claim 1, further comprising a wavelength converting layer interposed between the substrate and the overcoating layer, and wherein an edge portion of the wavelength converting layer extends beyond an edge portion of the plurality of convex portions and the plurality of concave portions toward the non-emitting area.

10. The organic light emitting diode display device of claim 9, further comprising a bank over the overcoating layer and including an opening exposing the first electrode, wherein the plurality of convex portions and the plurality of concave portions are formed in the opening.

11. The organic light emitting diode display device of claim 10, wherein the plurality of convex portions and the plurality of concave portions contact an edge portion of the bank.

12. The organic light emitting diode display device of claim 10, wherein the bank overlays an edge portion of the convex portions and the plurality of concave portions.

13. The organic light emitting diode display device of claim 10, wherein an edge portion of the wavelength converting layer, an edge portion of the plurality of convex portions and the plurality of concave portions and an edge portion of the bank overlap one another in the non-emitting area.

14. The organic light emitting diode display device of claim 1, wherein a border portion of the emitting area and the non-emitting area overlaps an edge portion of the plurality of convex portions and the plurality of concave portions.

15. The organic light emitting diode display device of claim 1, wherein the convex portion constitutes one of a hexagonal shape and a honeycomb structure in a plan view.

16. The organic light emitting diode display device of claim 1, wherein the flat portion has a circular shape in a plan view, and the top surface portion has a hexagonal shape in a plan view.

17. The organic light emitting diode display device of claim 7, wherein the first electrode directly contacts the flat portion such that:

a light emitted from the light emitting diode is reflected by the cholesteric liquid crystal layer and re-enters the light emitting diode;

the light re-reflected by the second electrode passes through the first electrode and the side surface portion to become a first light having different optical paths; and the light re-reflected by the second electrode passes through the first electrode and the flat portion to become a second light having same optical paths.

18. The organic light emitting diode display device of claim 4, further comprising a surface treatment layer on the linear polarizing plate, wherein the surface treatment layer includes an anti-glare layer having a silica bead.

* * * * *